(12) United States Patent
Mallwitz

(10) Patent No.: US 8,964,400 B2
(45) Date of Patent: Feb. 24, 2015

(54) CIRCUITRY ARRANGEMENT FOR REDUCING A TENDENCY TOWARDS OSCILLATIONS

(71) Applicant: SMA Solar Technology AG, Niestetal (DE)

(72) Inventor: Regine Mallwitz, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 14/210,697

(22) Filed: Mar. 14, 2014

(65) Prior Publication Data

US 2014/0192487 A1 Jul. 10, 2014

Related U.S. Application Data

(63) Continuation of application No. PCT/EP2012/068191, filed on Sep. 17, 2012.

(30) Foreign Application Priority Data

Sep. 16, 2011 (DE) .......................... 10 2011 053 680

(51) Int. Cl.
*H05K 1/18* (2006.01)
*H01L 23/66* (2006.01)
(Continued)

(52) U.S. Cl.
CPC .............. *H05K 1/181* (2013.01); *H01L 23/66* (2013.01); *H02M 7/003* (2013.01); *H05K 1/0228* (2013.01); *H05K 1/165* (2013.01); *H05K 1/0234* (2013.01); *H05K 1/0263* (2013.01); *H05K 2201/0723* (2013.01); *H05K 2201/083* (2013.01); *H05K 2201/0792* (2013.01);
(Continued)

(58) Field of Classification Search
USPC ......... 361/748, 782, 792, 794, 807, 811, 821, 361/836; 174/260, 261
See application file for complete search history.

(56) References Cited

U.S. PATENT DOCUMENTS

| | | | |
|---|---|---|---|
| 6,166,933 A | 12/2000 | Bowers | |
| 7,023,086 B2* | 4/2006 | Gutsmann et al. ............ | 257/728 |
| 2002/0015293 A1* | 2/2002 | Akiba et al. .................. | 361/793 |
| 2005/0068751 A1 | 3/2005 | Kim et al. | |
| 2009/0296362 A1 | 12/2009 | Okano | |

FOREIGN PATENT DOCUMENTS

| | | |
|---|---|---|
| DE | 10123232 A1 | 11/2002 |
| DE | 10333806 A1 | 2/2005 |

(Continued)

OTHER PUBLICATIONS

International Search Report dated Dec. 5, 2012 for International application No. PCT/EP2012/068191. 10 Pages.

*Primary Examiner* — Jenny L Wagner
*Assistant Examiner* — Michael P McFadden
(74) *Attorney, Agent, or Firm* — Eschweiler & Associates, LLC

(57) ABSTRACT

A circuitry arrangement includes several electronic parts mounted to a circuit board, at least one conductor section extending between the electronic parts within a first conductor layer, and a closed conductor loop comprising at least one loop section running in parallel to the at least one conductor section within a second conductor layer neighboring the first conductor layer. The closed conductor loop is configured to reduce a tendency towards oscillations of a current flowing through the conductor section in operation of the circuitry arrangement. The conductor loop is closed via at least one electronic component mounted to an outer surface of the circuit board.

15 Claims, 3 Drawing Sheets

(51) Int. Cl.
*H02M 7/00* (2006.01)
*H05K 1/02* (2006.01)
*H05K 1/16* (2006.01)

(52) U.S. Cl.
CPC ............... *H01L 2224/48091* (2013.01); *H01L 2224/48227* (2013.01); *H01L 2224/49175* (2013.01)
USPC .......................................... 361/748; 257/728

(56) References Cited

FOREIGN PATENT DOCUMENTS

| | | |
|---|---|---|
| DE | 102009026479 A1 | 12/2010 |
| JP | 2003101239 A | 4/2003 |
| KR | 100771146 B1 | 10/2007 |
| WO | 03054959 A2 | 7/2003 |

\* cited by examiner

CIRCUITRY ARRANGEMENT FOR REDUCING A TENDENCY TOWARDS OSCILLATIONS

CROSS REFERENCE TO RELATED APPLICATIONS

This application is a continuation of International Application number PCT/EP2012/068191 filed on Sep. 17, 2012, which claims priority to German application number 10 2011 053 680.9 filed on Sep. 16, 2011.

FIELD

The present disclosure relates to a circuitry arrangement for reducing a tendency towards oscillations of a current flowing between electronic parts in operation of the circuitry arrangement.

BACKGROUND

If a frequency at which a current is switched in an electric circuitry or a harmonic of this frequency matches an eigenfrequency of the electric circuitry, undesired oscillations of the current may be caused. These oscillations may reach a considerable amplitude. In commutating circuits, such oscillations may temporarily counteract a commutation and even generate over-voltages and over-currents which endanger the integrity of the parts of the commutating circuit. Further, electromagnetic fields irradiated by such oscillating currents may couple in other electronic parts and interfere with their function. Thus, reducing oscillations of currents, particularly of switched currents, occurring at a high frequency is often desirable. With many circuitries it is a requirement for their proper function.

A circuitry arrangement for reducing a tendency towards oscillations is known from DE 101 59 851 A1. This circuitry arrangement includes at least two semiconductor parts each comprising two terminals, one terminal of the one semiconductor part being electrically connected to one terminal of the other semiconductor part. Above this arrangement, at a distance to the two semiconductor parts, an eddy current attenuation structure is provided to attenuate oscillations which may occur during switching processes at a high frequency. The eddy current attenuation structure may be loop-shaped. The eddy current attenuation structure is not electrically connected to the semiconductor parts. The oscillations at a high frequency, however, generate eddy currents in the eddy current attenuation structure. The eddy current attenuation structure comprises a resistor resulting in ohmic losses of the eddy currents which attenuate the oscillations at the high frequency between the semiconductor parts. A sheet resistor of the preferably flat attenuation structure has to have a sufficiently high resistance to cause the ohmic losses of the induced eddy currents, but is has also to be small enough to allow for the generation of eddy currents. The resistance of the attenuation structure at which an optimum attenuation is provided shall be determined by measurements or simulations depending on the particular structure of the circuitry arrangement and the number of the semiconductor parts used. A simple adaptation of the attenuation structure to different semiconductor parts with which the circuitry arrangement is equipped, however, is not possible in this way.

A circuitry arrangement comprising electronic parts on an isolating substrate, magnetic materials being arranged in close vicinity to the electronic parts is known from DE 101 62 637 C1. The magnetic materials are galvanically separated from the electric circuitry arrangement but magnetically coupled thereto in such a way that electromagnetic resonances occurring at the electronic parts are attenuated. To have an effective coupling of the electromagnetic alternating field according to this principle, it is necessary to use magnetic materials, like for example ferromagnetic or ferrimagnetic materials, which have a high magnetic susceptibility. If the magnetic coupling between the alternating current and the magnetizable substance is successful, losses due to reversing the magnetization direction and due to magnetic hysteresis occur in the alternating field whose direction changes permanently. These losses are drawn from the source of the electromagnetic alternating field, i.e. from the resonant circuit, and thus attenuate the oscillations in the resonant circuit. Eddy currents in the magnetic materials shall be inhibited in the circuitry arrangement known from DE 101 62 637 C1.

A semiconductor module comprising a housing, a semiconductor element arranged in the housing and a framework is known from DE 101 23 232 A1. The framework comprises conductor tracks to which the semiconductor part is connected in an electrically conductive way. In the interior of the housing a casting compound is provided which is applied to the semiconductor part. The casting compound and/or the material of the housing are provided as attenuation materials with electromagnetically attenuating properties.

KR 100771146 B discloses a circuitry arrangement for suppressing switching oscillations and electromagnetic interferences at a high frequency. In this circuitry arrangement, a capacitor is provided between a conductor layer at power potential and a conductor layer at earth potential. The dielectric material of the capacitor comprises a high dielectric constant.

JP 2003101239 A also discloses a chip-capacitor for suppressing switching oscillations in a circuit board comprising several conductor layers. The chip capacitor is integrated in an isolation layer across which a power supply conductor and an earth conductor are facing each other.

US 2009/0296362 A1 discloses a multilayer printed circuit board having a plurality of wiring layers and an electronic component mounted thereon. Further, the circuit board includes a spiral EMI restriction wiring including a path in a substantial spiral shape configured with a printed wire section of a substantial loop shape provided along the circumference on each of at least two wiring layers. and a plug provided on each wiring layer arranged between a neighboring top wiring layer and a neighboring bottom wiring layer. A resistance element is inserted at some midpoint of the printed wire section at the outer surface of the circuit board. The resistance element converts energy of EMI coupled into the EMI restriction wiring into thermal energy.

US 2005/0068751A1 discloses a printed circuit board having a signal layer with signal traces, e. g. conductive paths, that electrically connect components, such as processors and integrated circuits, and one or more voltage planes, such as a power plane and a ground plane. For reducing electromagnetic resonance between voltage planes which may increase the impedance associated with a printed circuit board, one or more floating traces are provided on the signal layer. The floating traces are electrically conductive paths routed along the signal layer, that are electrically coupled to a voltage plane.

DE 103 33 806 A1 discloses a printed circuit board including at least one electronic component to be shielded and a shielding at least partially enclosing the electronic component. The shielding comprises a plane lid, a plane bottom and a wall element connecting the lid and the bottom.

There still is a need of a circuitry arrangement in which an attenuation of oscillations of a current flowing in operation of the circuitry arrangement can be optimized depending on the actual assembly of the circuit board with electronic parts.

SUMMARY

The present disclosure relates to a circuitry arrangement comprising several electronic parts mounted to a circuit board; at least one conductor section extending between the electronic parts within a first conductor layer, a current tending towards oscillations flowing through the conductor section in operation of the circuitry arrangement. The circuitry arrangement further comprises a closed conductor loop comprising at least one loop section extending in parallel to the at least one conductor section in a second conductor layer neighboring the first conductor layer. The at least one conductor section and the at least one loop section are facing each other across an isolation layer of the circuit board. The conductor loop is closed via at least one electronic component mounted to an outer surface of the circuit board.

Other features and advantages of the present disclosure will become apparent to one with skill in the art upon examination of the following drawings and the detailed description. It is intended that all such additional features and advantages be included herein within the scope of the present disclosure, as defined by the claims.

BRIEF DESCRIPTION OF THE DRAWINGS

The disclosure can be better understood with reference to the following drawings. The components in the drawings are not necessarily to scale, emphasis instead being placed upon clearly illustrating the principles of the present disclosure. In the drawings, like reference numerals designate corresponding parts throughout the several views.

DETAILED DESCRIPTION

Figure 1:
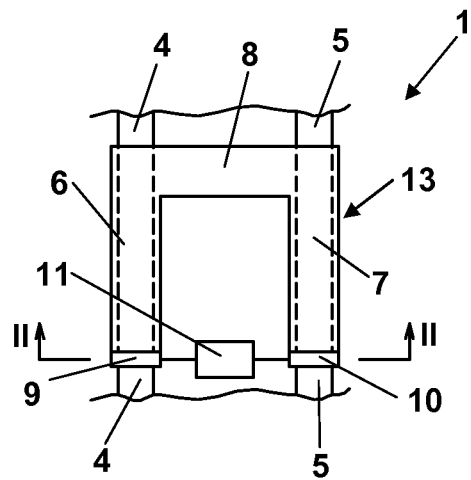
FIG. 1 shows a first embodiment of a circuitry arrangement in a top view onto its conductor and loop sections running in different layers of a circuit board which is not depicted here.

The present disclosure relates to a circuitry arrangement comprising a plurality of electronic parts mounted to a circuit board, at least one conductor section extending between the electronic parts within a first conductor layer of the circuit board, a current tending towards oscillations flowing through the conductor section in operation of the circuitry arrangement, and a closed conductor loop comprising at least one loop section extending in parallel to the at least one conductor section within a second conductor layer of the circuit board neighboring the first conductor layer of the circuit board.

The current flowing through the conductor section in operation of the circuitry arrangement may particularly tend to oscillations at a high frequency due to switching processes affecting the current. For example, the conductor section may be part of a commutating circuit of an electric circuitry formed by the electronic parts of the circuitry arrangement.

According to the present disclosure, a circuitry arrangement comprises a plurality of electronic parts mounted to a circuit board; at least one conductor section extending between the electronic parts within a first conductor layer, and a closed conductor loop comprising at least one loop section running in parallel to the at least one conductor section within a second conductor layer neighboring the first conductor layer. The conductor loop is closed via at least one electronic component mounted to an outer surface of the circuit board. In one embodiment, this part is a so-called SMD (Surface Mounted Device). The closed conductor loop is configured to reduce a tendency towards oscillations of a current flowing through the at least one conductor section in operation of the circuitry arrangement.

Due to the relative arrangement of the conductor section and the loop section within the two neighboring conductor layers, the conductor loop is coupled to the conductor section through which the current tending towards oscillations flows in such a way that oscillations of the current through the conductor section generate an oscillating current through the conductor loop. This coupling is in one embodiment transformer-like but it may also have capacitive components. The electric properties of the conductor loop are determined by the electronic component closing the conductor loop. This electronic component particularly determines both the resistance which attenuates the current oscillating through the conductor loop, and thus the undesired oscillations of the current flowing through the conductor section, by ohmic losses, and the eigenfrequency of the conductor loop at which the coupling to the conductor section, and thus the attenuation, is particularly effective. As a result, the conductor loop can be tuned to the oscillations to be attenuated by means of the electronic component. In the circuitry arrangement according to the present disclosure, this tuning may also be executed at a later point in time as the electronic component mounted at an outer surface may be replaced by another surface-mounted electronic component easily. Thus, the new circuitry arrangement may particularly easily be adapted to a varied assembly of the circuit board with other electronic parts, like for example with other semiconductor switches switching the current flowing through the conductor section. No basic new design of the circuitry arrangement is necessary in case of any such variation.

In a simple case, the electronic component of the conductor loop mounted to the outer surface of the circuit board is an ohmic resistor, i.e., particularly a so-called SMD resistor. As an alternative or in addition to an ohmic resistor, the conductor loop may also comprise a capacitive and/or inductive SMD to vary the inherent capacitance or inductance of the conductor loop, respectively.

In one embodiment, the second conductor layer within which the loop section extends is located below the outer surface of the circuit board of the circuitry arrangement, and the conductor loop extends within this second conductor layer, i.e., over its full length between two terminals for the at least one surface-mounted electronic component.

The electronic parts between which the conductor section extends may be mounted to the same outer surface to which the at least one electronic component closing the conductor loop is mounted. In this case, changing these electronic parts is also easy and leaves the basic topology of the circuit board untouched.

The number of the terminals which lead from the second conductor layer to the outer surface of the circuit board is exactly two in one embodiment, and they are provided for a single surface-mounted electronic component or a single series connection of surface-mounted electronic components.

In the circuitry arrangement of the present disclosure according to one embodiment, the conductor section and the loop section are electrically isolated from each other, and they may particularly be separated from each other by an isolating layer of the circuit board. In one embodiment, the conductor section and the loop section face each other across this isolating layer in a two-dimensional way. This, inter alia, means that they mutually cover each other over their width.

The term circuit board as used here covers the option to realize the circuitry arrangement of the present disclosure including its conductor loop at a so-called Direct Bonded Copper (DBC) or Insulated Metal (ISM) substrate. In this case, all loop sections extending within the second conductor layer may be formed by metal coatings of the rear side of the substrate or by parts of a metal layer within the substrate, and the circuitry arrangement according to the present disclosure including the substrate may be mounted to a further circuit board.

The thickness of the electrically conductive metal layer in the area of the loop sections of the conductor loop in the second conductor layer may be in the range of usual thicknesses of conductor tracks of usual circuit boards and of usual metal layers of DBC and ISM substrates, i.e., in a typical range of 0.035 mm to 0.3 mm, whereas the width of the loop sections may be in a typical range of a few millimeters, for example. The distance between the loop sections within the second conductor layer from the at least one conductor section within the first conductor layer may be in the range of typical thicknesses of usual circuit boards and DBC or ISM substrates, i.e., in a range of a tenth of a millimeter to a few millimeters, for example. The area covered by the conductor loop—depending on the electronic parts of the circuitry arrangement of the present disclosure—may be in a typical range of a few to some square centimeters, for example.

If the current tending towards oscillations in operation of the circuitry arrangement flows through at least two conductor sections of anti-parallel orientation, i.e., through one of the two sections in one direction and through the other of the two sections in the opposite direction, it proves to be advantageous that the conductor loop comprises two loop sections of anti-parallel orientation which each run in parallel to one of the conductor sections to realize a maximum coupling of the conductor loop to the conductor sections.

In an embodiment of the circuitry arrangement according to the present disclosure, the conductor sections and the parallel loop sections of the conductor loop are at least partially shielded by a common electromagnetic shielding. On the one hand, this shielding avoids that electromagnetic radiation generated by the oscillations of the currents through the conductor sections and the conductor loop couple into other parts. On the other hand, the shielding provides for an increased coupling of the conductor loop to the conductor sections with regard to the oscillations of the current flowing through the conductor sections to be attenuated.

The electromagnetic shielding may particularly comprise flat sections of diamagnetic metallic material within further conductor layers of the circuit board, but may also comprise sections of diamagnetic material running orthogonally thereto. The diamagnetic metallic material may be a material of which the usual conductors of the respective circuit board are made, i.e., particularly copper.

The at least one conductor section of the circuitry arrangement of the present disclosure may also be part of a conductor loop. Particularly, it may be a part of a commutating circuit in which occurring oscillations of the current may result in an undesired counteraction to the commutation.

Figure 2:
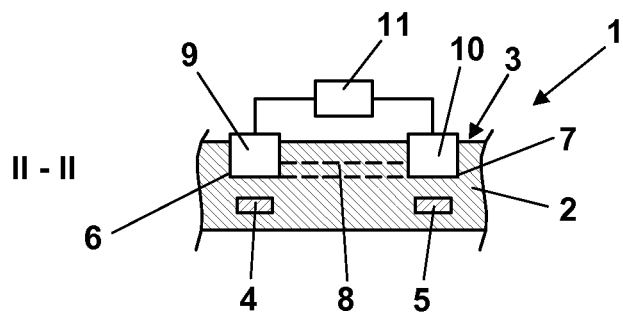
FIG. 2 is a cross section along line II-II in FIG. 1 through the first embodiment of the circuitry arrangement, the circuit board being depicted here.
Figure 4:
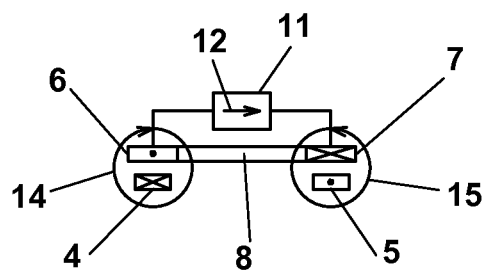
FIG. 4 is a schematic depiction of the function of the circuitry arrangement.

Now referring in greater detail to the drawings, FIGS. 1 and 2 show a circuitry arrangement 1 realized at a circuit board 2 comprising two isolated conductor layers below an outer surface 3. Two first conductor sections 4 and 5 extend within the lower conductor layer. Two loop sections 6 and 7 of a conductor loop 13 extend within the upper conductor layer, each in parallel to one of the conductor sections 4 and 5. A traverse section 8 connects the loop sections 6 and 7 at their one ends. At the other ends of the loop sections 6 and 7 terminals 9 and 10 are provided for an electronic component 11 mounted at the outer surface 3 of the circuit board 2. In the present embodiment of the circuitry arrangement 1, the electronic component 11 is a resistor. By means of this resistor 11, the conductor loop 13 which is otherwise made of the loop sections 6 and 7 and the traverse section 8 is closed. Due to its arrangement relative to the conductor sections 4 and 5, the conductor loop 13 is coupled to the conductor sections 4 and 5 in such a way that, when a current flows through the conductor sections 4 and 5 and oscillates at a high frequency between electronic parts of the circuitry arrangement 1 (not depicted here), a current is also generated in the conductor loop 13 and oscillates at the same frequency. This is illustrated in FIG. 4 in which a momentary current flow direction through the conductor sections 4 and 5 and the resulting magnetic fields 14 and 15 are indicated by direction symbols. Further, the resulting direction 12 of the current flowing through the conductor sections 6 and 7 and the resistor 11 is also indicated. The current flowing in the current flow direction 12 is attenuated by the resistor 11, and thus, there is also an attenuation to the current flowing through the conductor sections 4 and 5.

Figure 3:
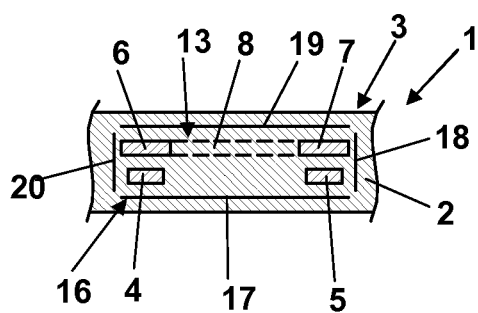
FIG. 3 is a cross section through a second embodiment of the circuitry arrangement.

In the embodiment of the circuitry arrangement 1 according to FIG. 3, not showing the connection of the surface mounted resistor 11, the parallel arrangement of the conductor sections 4 and 5 on the one hand and the loop sections 6 and 7 on the other hand is surrounded by a shielding 16 of two-dimensional sections 17 to 20 of diamagnetic material, particularly copper. This shielding 16 avoids or reduces leakage of electromagnetic radiation due to oscillating currents through the conductor sections 4 and 5 and simultaneously increases the coupling of the conductor loop 13 to the conductor sections 4 and 5. The coupling is particularly increased if the conductor sections 4 and 5 together with the parallel loop sections 6 and 7 are completely surrounded by the shielding 16 over their entire length, i.e. on all four sides corresponding to the depicted sections 17 to 20 and along their common parallel course. However, it is also possible to only partially enclose the sections 4 to 7, like for example only over a part of their common parallel course or on less than four sides, particularly only on those sides corresponding to the sections 17 and 19 extending within further conductor layers of the circuit board 2. Further, separate shieldings may be provided for the two section pairs 4 and 6 and 5 and 7.

In the circuitry arrangement 1, the electronic component 11 mounted at the surface 3 of the circuit board 2 and closing the conductor loop 13 is easily replaced. This means that the electronic component 11 may be exchanged for varying and optimizing the attenuation properties of the conductor loop 13 with regard to oscillating currents through the conductor sections 4 and 5 without amending the basic topology of the circuit board 2. For example, the electronic component 11 may be soldered to an uppermost or first metal layer of the circuit board 2. The conductor loop 13 may also partially or completely extend within the first metal layer, but it may alternatively completely or partially be provided in a lower metal or conductor layer within the circuit board 2. In one embodiment a conductor layer is selected which is directly neighboring the conductor layer of the conductor sections 4 and 5. From a point of view of the surface 3 at which the electronic component 11 is mounted, the conductor layer of the conductor sections 4 and 5 may be above or below the conductor layer of the loop sections 6 and 7. Instead of a conductor loop 13 comprising loop sections 6 and 7 only on one side of the conductor sections 4 and 5, i.e. above or below the conductor sections 4 and 5, two conductor loops 13 each comprising conductor sections 6 and 7 on one side of the conductor sections 4 and 5 may be provided. Further, one conductor loop 13 may comprise several windings. In this case, one winding may comprise loop sections 6 and 7 on one side and another winding loop sections 6 and 7 on the other side of the conductor sections 4 and 5. The circuit board 2 may be a DBC (Direct Bonded Copper) substrate in which copper layers are provided on one or both sides of a ceramic support as metallization layers. Further copper layers may be provided in the interior of the DBC substrate.

Figure 5:
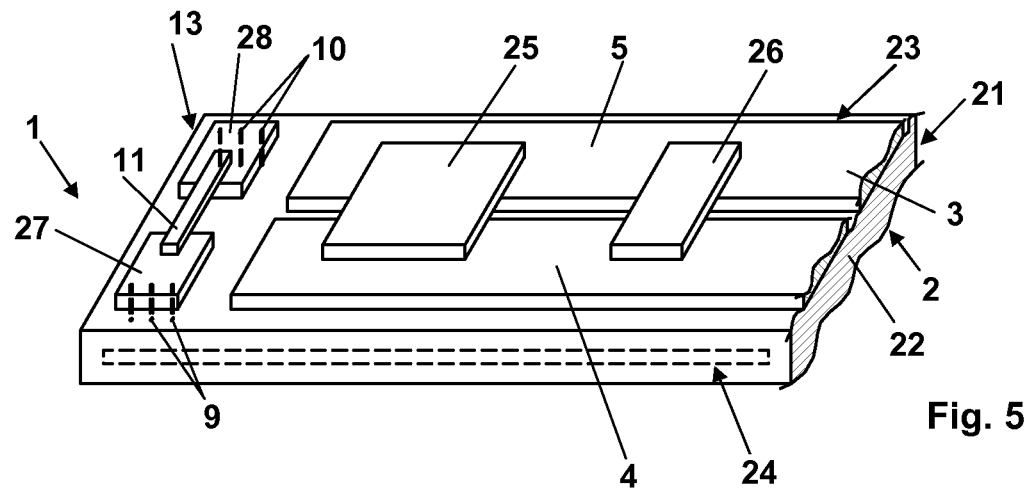
FIG. 5 is a perspective view of a further embodiment of the circuitry arrangement comprising a DBC substrate as a circuit board.
Figure 6:
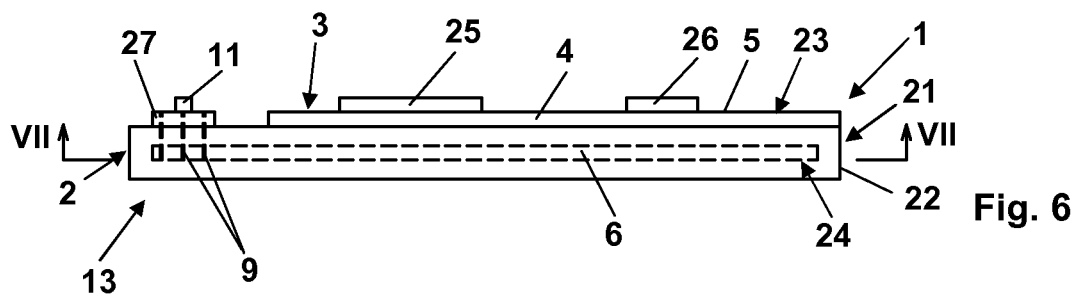
FIG. 6 is a side view of the embodiment of the circuitry arrangement according to FIG. 5.
Figure 7:
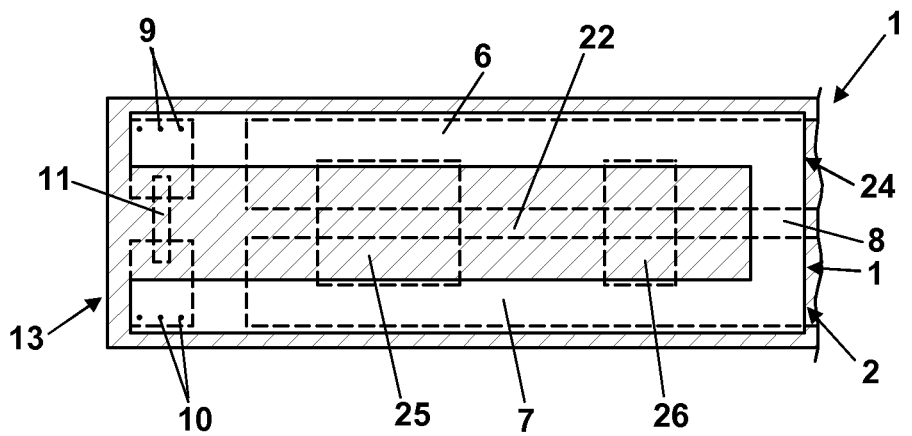
FIG. 7 is a section through the embodiment of the circuitry arrangement according to FIG. 5 along the line VII-VII in FIG. 6, some parts of the circuitry arrangement occluded in this section being depicted with dashed lines.

FIGS. 5 to 7 depict an embodiment of the circuitry arrangement 1 according to the present disclosure in which a PCB (Printed Circuit Board) substrate 21 is used as the circuit board 2. The substrate 21 comprises a support 22 and a copper layer 23 applied to the support 22 as well as a copper layer 24 within the support 22. The conductor sections 4 and 5 are formed from the copper layer 23. Two electronic parts 25 and 26 made as SMDs are each connected to both ends of the conductor sections 4 and 5 in an electrically conductive way. For example, the electronic part 25 may be a semiconductor switch to which a diode as the part 26 is connected in an anti-parallel way. The parts 25 and 26 may, in one embodiment, be provided in surface-mountable housings, like for example so-called ThinPaks. The copper layer 24 may alternatively be arranged on that side of the support 22 opposing the copper layer 23.

Upon switching a current flowing from the conductor section 4 through the part 25 to the conductor section 5 at a high frequency, currents oscillating at a high frequency may be generated in the commutating circuit including the diode 26. To attenuate these oscillations, the connector loop 13 is provided. Its loop sections 6 and 7 and the traverse section 8 are formed from the copper layer 24, here. The conductor loop 13 is closed via the terminals 9 and 10 projecting through the support 22, areas 27 and 28 of the copper layer 23 connected thereto and the resistor 11 made as an SMD and connected to the areas 27 and 28. The loop sections 7 and 6 extend in parallel to the conductor sections 4 and 5 located at the upper surface of the PCB substrate 32. The circuitry arrangement depicted in FIGS. 5 to 7 as a whole can be mounted to a larger circuit board via its lower copper layer 24, for example.

Figure 8:
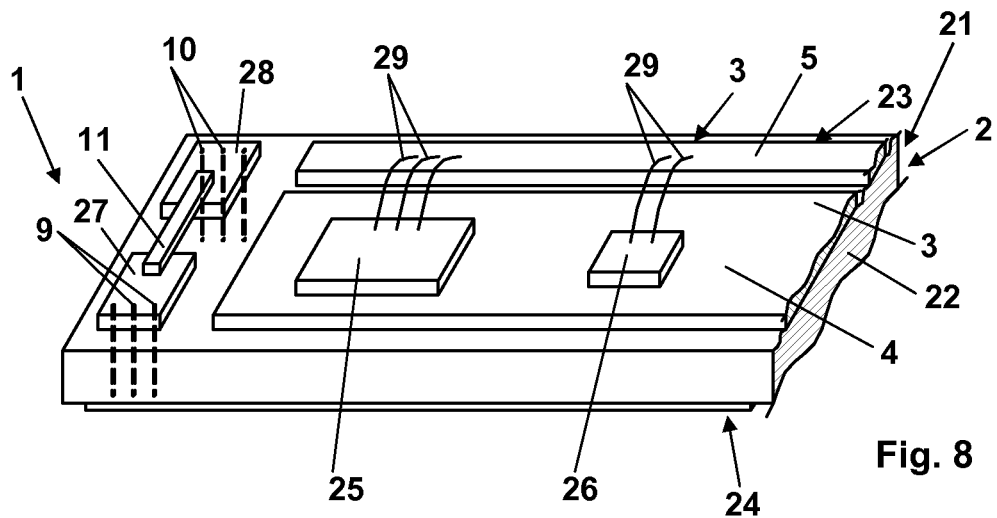
FIG. 8 is a perspective view of a further embodiment of the circuitry arrangement which also comprises a DBC substrate as a circuit board.
Figure 9:
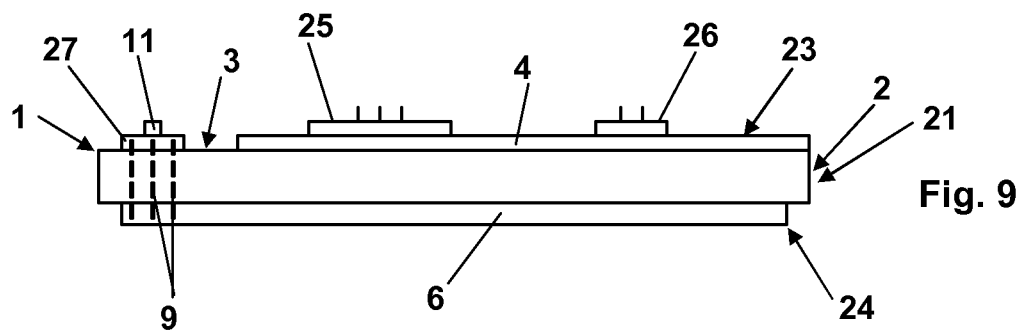
FIG. 9 is a side view of the embodiment of the circuitry arrangement according to FIG. 8.
Figure 10:
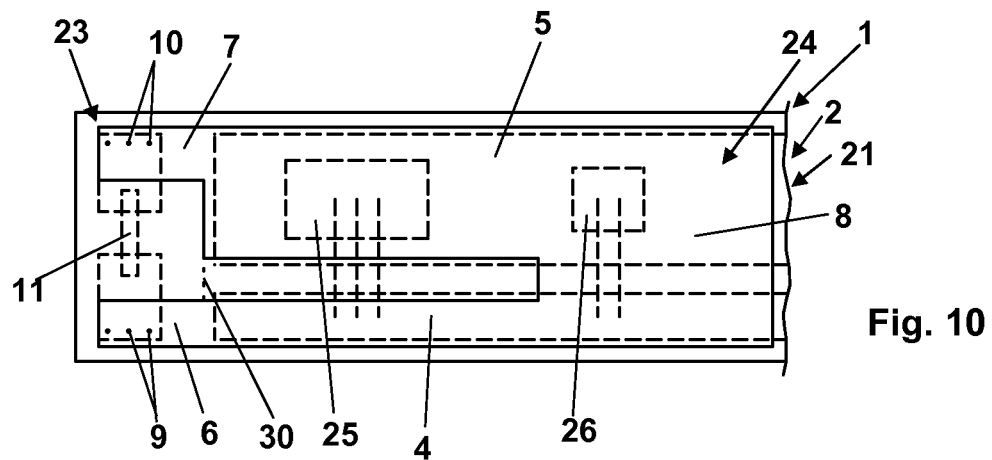
FIG. 10 is a bottom view of the embodiment of the circuitry arrangement according to FIG. 8, some parts of the circuitry arrangement occluded in this view being depicted with dashed lines.

This also applies to the embodiment of the embodiment of the circuitry arrangement 1 depicted in FIGS. 8 to 10, in which a DBC substrate 21 serves as the circuit board 2. Here, the electronic parts 25 and 26 may again be a semiconductor switch and an anti-parallel diode. The electronic parts 25 and 26, however, are directly, i.e., without package, mounted to the conductor section 4 from above and contacted to the conductor section 5 via bond wires 29. Other than this, the construction of the circuitry arrangement 1 at the upper side of the DBC substrate 21 corresponds to that one of the PCB substrate 32 according to FIGS. 5 to 7. At the lower side of the DBC substrate 21, the loop sections 6 and 7 and the traverse section 8 are again formed by the copper layer 24. Here, the traverse section may even be broader than depicted with a full line here. In an extreme case, the traverse section 8, towards the terminals 9 and 10, terminates at the boundary 30 depicted with a dashed line here, so that eddy currents may additionally be generated in the copper layer 24 by the currents oscillating between the electronic parts 25 and 26. These eddy currents also have an attenuating effect on the oscillating current. However, even in this extreme case, there is still a current generated through the entire conductor loop 13 including the resistor 11 which is mounted at the surface 3 of the DBC substrate 21. Due to the large scale structure of the loop sections 6 and 7 and the traverse section 8, the disposal of heat out of the DBC substrate 21 via the copper layer 24 towards a heat sink (not depicted) is enhanced.

Many variations and modifications may be made to the embodiments of the disclosure without departing substantially from the spirit and principles of the disclosure. All such modifications and variations are intended to be included herein within the scope of the present disclosure, as defined by the following claims.

The invention claimed is:

1. A circuitry arrangement, comprising:
several electronic parts mounted to a circuit board;
at least one conductor section extending between the electronic parts within a first conductor layer, and configured to conduct a current tending towards oscillations flowing through the conductor section in operation of the circuitry arrangement; and
a closed conductor loop comprising at least one loop section extending in parallel to the at least one conductor section within a second conductor layer neighboring the first conductor layer;
wherein the at least one conductor section and the at least one loop section are facing each other across an isolation layer of the circuit board; and
wherein the closed conductor loop is closed via at least one electronic component mounted to an outer surface of the circuit board.

2. The circuitry arrangement of claim 1, wherein the at least one electronic component is a Surface Mounted Device (SMD).

3. The circuitry arrangement of claim 1, wherein the at least one electronic component is a passive electronic component.

4. The circuitry arrangement of claim 3, wherein the at least one electronic component is a resistor.

5. The circuitry arrangement of claim 1, wherein the second conductor layer extends below the outer surface of the circuit board.

6. The circuitry arrangement of claim 1, wherein the electronic parts are mounted to the same outer surface of the circuit board to which the at least one electronic component closing the conductor loop is mounted.

7. The circuitry arrangement of claim 1, wherein the conductor loop, at a region between terminals for the at least one electronic component, extends within the second conductor layer.

8. The circuitry arrangement of claim 7, wherein the conductor loop is closed by means of exactly one electronic component mounted to the outer surface of the circuit board.

9. The circuitry arrangement of claim 1, wherein an eigenfrequency of the conductor loop is tuned to a frequency of the oscillations of the current tending towards oscillations flowing through the at least one conductor section in operation of the circuitry arrangement by means of the electronic component mounted to the outer surface of the circuit board.

10. The circuitry arrangement of claim 1, wherein the circuit board comprises a substrate selected from Direct Bonded Copper (DBC) substrates and Insulated Metal (ISM) substrates.

11. The circuitry arrangement of claim 1, wherein the current tending towards oscillations flowing through the at least one conductor section in operation of the circuitry arrangement flows in opposite directions through a further conductor section of anti-parallel orientation, and wherein the conductor loop comprises loop sections of anti-parallel orientation each running in parallel to one of the conductor sections, respectively.

12. The circuitry arrangement of claim 1, wherein the at least one conductor section and the at least one loop section together are at least partially shielded by a common electromagnetic shielding.

13. The circuitry arrangement of claim 12, wherein the electromagnetic shielding comprises two-dimensional sections of a diamagnetic metallic material within further conductor layers of the circuit board.

14. The circuitry arrangement of claim 1, wherein the at least one conductor section is part of a commutation circuit.

15. The circuitry arrangement of claim 14, wherein the electronic parts include a semiconductor switch and wherein the commutation circuit is configured to support commutation of the semiconductor switch.

\* \* \* \* \*